(12) United States Patent
Lafort

(10) Patent No.: US 12,506,449 B2
(45) Date of Patent: Dec. 23, 2025

(54) AMPLIFIER FOR A DUAL BACKPLATE MEMS MICROPHONE

(71) Applicant: Sonion Nederland B.V., Hoofddorp (NL)

(72) Inventor: Adrianus Maria Lafort, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 230 days.

(21) Appl. No.: 18/263,961

(22) PCT Filed: Nov. 16, 2021

(86) PCT No.: PCT/NL2021/050704
§ 371 (c)(1),
(2) Date: Aug. 2, 2023

(87) PCT Pub. No.: WO2022/169355
PCT Pub. Date: Aug. 11, 2022

(65) Prior Publication Data
US 2024/0088839 A1 Mar. 14, 2024

(30) Foreign Application Priority Data
Feb. 3, 2021 (NL) .................................. 2027482

(51) Int. Cl.
*H03F 3/183* (2006.01)
*G01R 31/28* (2006.01)
(Continued)

(52) U.S. Cl.
CPC ......... *H03F 3/183* (2013.01); *G01R 31/2825* (2013.01); *H04R 3/00* (2013.01);
(Continued)

(58) Field of Classification Search
CPC . H03F 3/183; H03F 2200/03; G01R 31/2825; H04R 3/00; H04R 19/04;
(Continued)

(56) References Cited

U.S. PATENT DOCUMENTS 8,855,335 B2   10/2014  Henriksen
10,045,121 B2 *  8/2018  Harney ............... H03F 3/45071
(Continued)

OTHER PUBLICATIONS

International Search Report for International application No. PCT/NL2021/050704 dated May 12, 2022.

*Primary Examiner* — Xu Mei
(74) *Attorney, Agent, or Firm* — Harness, Dickey & Pierce, P.L.C.

(57) ABSTRACT

An amplifier for a dual backplate MEMS microphone comprising at least a first source follower which has a gate for connection to a first backplate of the dual backplate MEMS microphone, and a load circuit connected to a source of the first source follower which provides an output signal of the filter, which filter comprises a second source follower connected to a second backplate of the dual backplate MEMS microphone, and a distortion detection circuit which is connected to the source of the first source follower and to the source of the second source follower for measuring distortion of the output signal at the source of the first source follower, wherein said distortion detection circuit is connected to a correctional circuit that drives at least a first bias current source for the first source follower.

9 Claims, 3 Drawing Sheets

Figure 1:
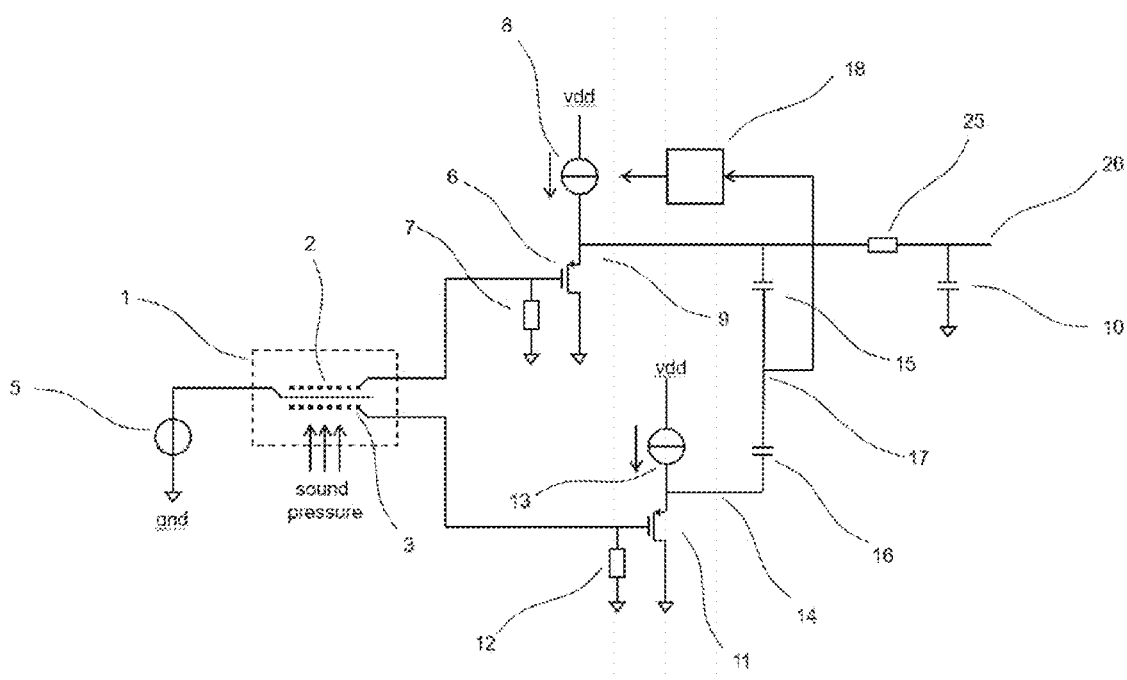

(51) Int. Cl.
*H04R 3/00* (2006.01)
*H04R 19/04* (2006.01)

(52) U.S. Cl.
CPC ......... *H04R 19/04* (2013.01); *H03F 2200/03* (2013.01); *H04R 2201/003* (2013.01)

(58) Field of Classification Search
CPC ............ H04R 2201/003; H04R 29/004; H04R 19/005; H04R 19/016
USPC ..... 381/111–115, 120, 91, 92, 122, 174, 171
See application file for complete search history.

(56) References Cited

U.S. PATENT DOCUMENTS

| | | | |
|---|---|---|---|
| 10,951,169 B2* | 3/2021 | Lafort | H04R 3/00 |
| 11,528,545 B2* | 12/2022 | Florian | H03F 3/185 |
| 12,225,349 B1* | 2/2025 | Zhou | H04R 19/04 |
| 2013/0044899 A1* | 2/2013 | Barber | H04R 19/016 |
| | | | 381/113 |
| 2014/0266260 A1 | 9/2014 | Wurzinger et al. | |
| 2014/0376749 A1 | 12/2014 | Nielsen | |
| 2015/0023529 A1* | 1/2015 | Barzen | H04R 19/005 |
| | | | 381/174 |
| 2015/0129992 A1* | 5/2015 | Hur | C25D 3/46 |
| | | | 257/416 |
| 2016/0080879 A1 | 3/2016 | Wiesbauer et al. | |
| 2017/0318395 A1 | 11/2017 | Harney et al. | |
| 2018/0332377 A1* | 11/2018 | Polo | H03F 3/505 |

* cited by examiner

AMPLIFIER FOR A DUAL BACKPLATE MEMS MICROPHONE

CROSS-REFERENCE TO RELATED APPLICATIONS

This application is a national phase under 35 U.S.C. § 371 of PCT International Application No. PCT/NL2021/050704 which has an International filing date of Nov. 16, 2021, which claims priority to Netherland Patent Application No. 2027482, filed Feb. 3, 2021, the entire contents of each of which are hereby incorporated by reference.

The invention relates to an amplifier suitable for a dual backplate MEMS microphone comprising at least a first source follower which has a gate for connection to a first backplate of the dual backplate MEMS microphone.

The invention also relates to a microphone assembly comprising a dual backplate MEMS microphone and the amplifier of the invention.

The invention further relates to an assembly of the amplifier of the invention with any other type of sensor.

The invention particularly relates to a hearing device, hearing aid, hearable, personal audio device, portable audio device, headphone, in-ear device, earbud and the like, assembled together with the amplifier of the invention.

US2017/0318395 relates to improving noise rejection of a MEMS microphone. The MEMS microphone connects to an electronic amplifier that buffers the electrical signal of the microphone to generate a buffered output signal representing the acoustic pressure received by the MEMS microphone.

There is a need for an amplifier with low noise and low power consumption to process the signal of the MEMS microphone. Generally speaking each MEMS microphone has a resonance frequency which is kept as low as possible, and preferably just above an audible frequency range of interest to improve microphone sensitivity in this frequency range of interest. A known way to reduce the peak response at the resonance frequency and to improve the microphone sensitivity is to apply damping, which however goes at the expense of increased noise levels. Instead of using damping, it is also possible to apply low-pass filtering of the amplified signal of the dual backplate MEMS microphone. A commonly known low-pass filter involves a resistor and a capacitor in series, wherein noise can be kept low by limiting the resistor value and applying a relatively large capacitor. A typical resistor value may be 10 kOhm, but this is not essential.

When such an amplifier is loaded with a relatively large capacitive load to process the signal which is buffered through the first source follower, the signal from the first source follower may get distorted, particularly with large signal amplitudes. The problem is that the source follower has asymmetric current drive capability because of its limited capability to provide current, which leads to distortion when the source follower is required to provide high currents.

An object of the invention is therefore to provide an amplifier according to the preamble, wherein the problem of distortion is limited or avoided.

The amplifier of the invention is therefore provided with the features of one or more of the appended claims.

In general terms the amplifier of the invention comprises also a second source follower connected to a second backplate of the dual backplate MEMS microphone, and the amplifier comprises further a distortion detection circuit that is connected to the source of the first source follower and to the source of the second source follower for measuring distortion of the output signal at the source of the first source follower, wherein said distortion detection circuit is connected to a correctional circuit that drives at least a first bias current source for the first source follower.

This arranges that only in a situation of high current demand the level of current through the first source follower can be increased by controlling the first bias current source for the first source follower, and that when the current level is modest, the first bias current source only has to deliver a limited amount of current so as to answer to the need of low power consumption.

Suitably the distortion detection circuit comprises at least two capacitors that are connected to each other in series through a node, wherein a first capacitor is further connected to the source of the first source follower, and a second capacitor is further connected to the source of the second source follower, and wherein the correctional circuit connects to the node that provides a connection between the first capacitor and second capacitor of the at least two capacitors. The correctional circuit is thus provided with a common mode voltage which is present on the node, which is superposed with the distortion of the signal that is present at the source of the first source follower.

The amplifier of the invention can be realized in different embodiments.

In one embodiment a load circuit is connectable or connected to the amplifier which provides a load only for the first source follower and to provide that the second source follower is unloaded, wherein the correctional circuit drives the first bias current source for the first source follower only; this will be elucidated hereinafter with reference to FIG. 1.

In other embodiments the correctional circuit drives the first bias current source for the first source follower and a second bias current source for the second source follower; this will be elucidated hereinafter with reference to FIGS. 3 and 4.

Figure 3:
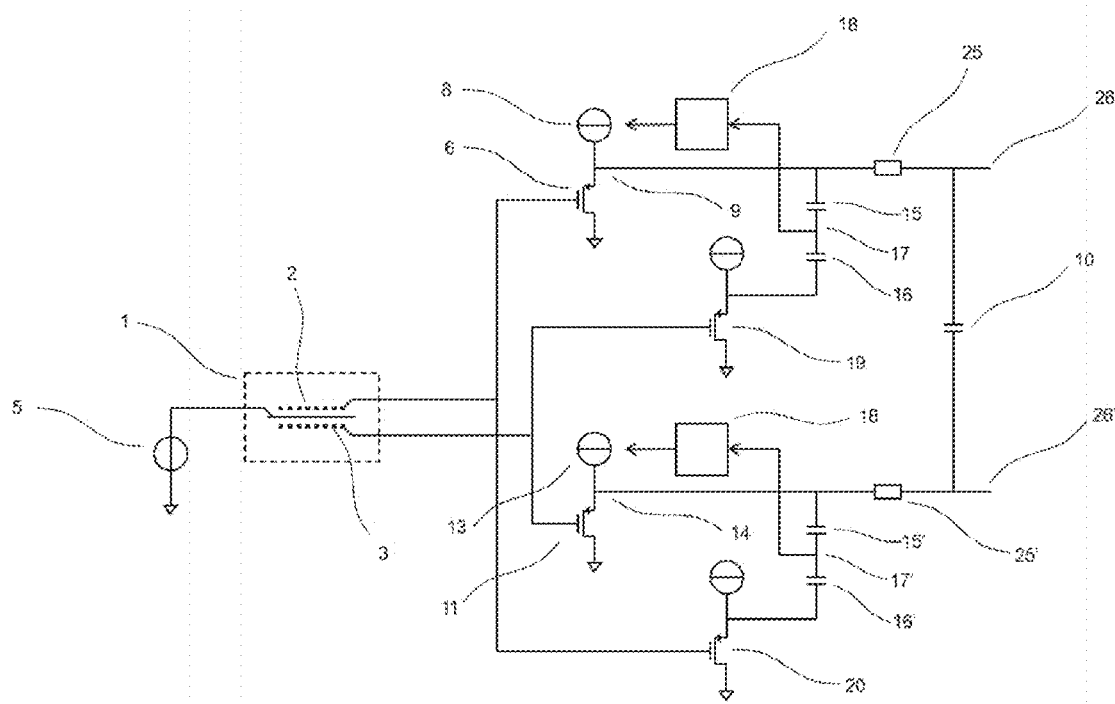
Figure 4:
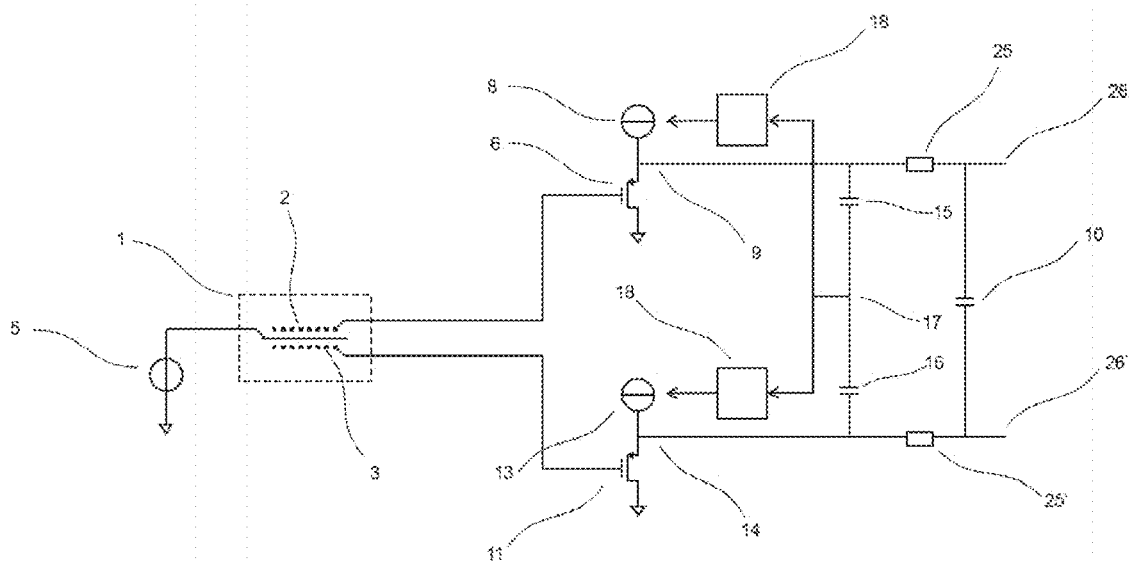

In the latter embodiments of FIGS. 3 and 4 it is preferred that the load circuit is connectable or connected between the source of the first source follower and the source of the second source follower.

In one embodiment the amplifier comprises two distortion detection circuits, a first distortion detection circuit connected to the source of the first source follower and to a source of a third source follower that is unloaded and having a gate connected to the second backplate of the dual backplate MEMS microphone, wherein the correctional circuit connects to the first distortion detection circuit and drives the first bias current source of the first source follower, and a second distortion detection circuit connected to the source of the second source follower and to a source of a fourth source follower that is unloaded and having a gate connected to the first backplate of the dual backplate MEMS microphone, wherein the correctional circuit connects to the second distortion detection circuit and drives the second bias current source of the second source follower. This will be elucidated hereinafter with reference to FIG. 3.

The invention will hereinafter be further elucidated with reference to the drawing of exemplary embodiments of an amplifier according to the invention that is not limiting as to the appended claims.

Figure 2A:
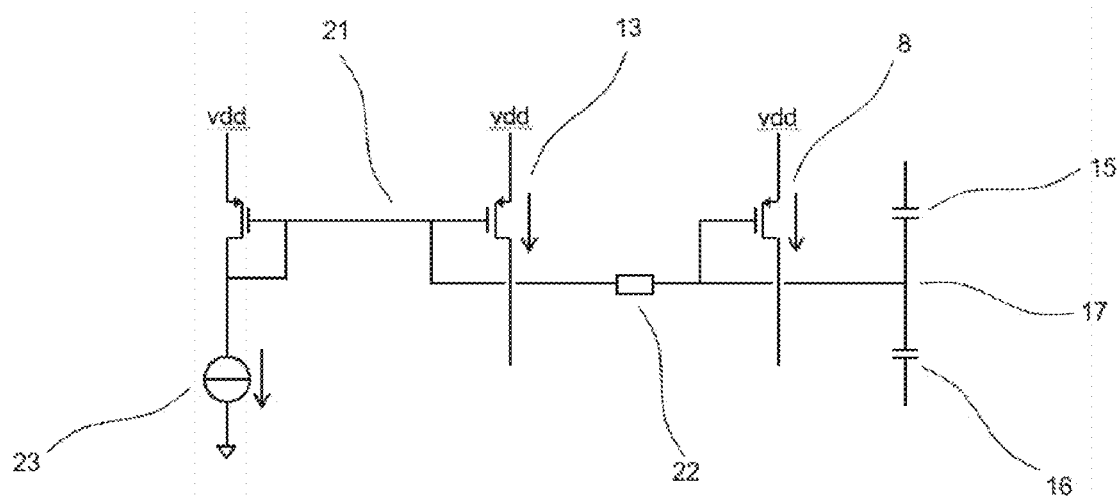

In the drawing:

FIG. 1 shows a first embodiment of an amplifier for a dual backplate MEMS microphone according to the invention;

FIGS. 2A/2B show examples of current sources that may be applied in the amplifier of the invention;

FIGS. 3 and 4 show further embodiments of the amplifier of the invention.

Whenever in the figures the same reference numerals are applied, these numerals refer to the same parts.

A common denominator for the respective embodiments of the amplifier of the invention for a MEMS microphone 1 is that the amplifier comprises at least a first source follower 6 which has a gate for connection to a first backplate 2 of the dual backplate MEMS microphone 1. In the respective embodiments a predominantly capacitive load circuit 25, 10 may at least be connected to a source of the first source follower 6 which provides an output signal at output 26 of the load circuit 25, 10. This is at least the case in an unbalanced embodiment as shown in FIG. 1. In embodiments that are arranged as a balanced amplifier as depicted in FIG. 3 and FIG. 4, an output signal may be present at said output 26, but also at its balanced counterpart output 26'.

Further the embodiments have in common that the amplifier comprises a second source follower 11 connected to a second backplate 3 of the dual backplate MEMS microphone 1, and that a distortion detection circuit 15, 16 is connected to the source 9 of the first source follower 6 for measuring distortion at the source 9 of the first source follower 6. Said source 9 forms an input of the load circuit 25, 10. The distortion detection circuit 15, 16 is in turn connected to a correctional circuit 18 that drives at least a first bias current source 8 for the first source follower 6. This is depicted in FIG. 1, FIG. 3 and FIG. 4.

FIG. 1 and FIG. 4 further respectively depict an unbalanced arrangement and a fully balanced arrangement of the amplifier of the invention, wherein the distortion detection circuit comprises at least two capacitors 15, 16 that are connected to each other in series through a node 17, and wherein a first capacitor 15 is connected to the source 9 of the first source follower 6, and a second capacitor 16 is connected to the source 14 of the second source follower 11. The correctional circuit 18 connects to the node 17 that provides a connection between the at least first capacitor 15 and second capacitor 16. Like FIG. 4 also FIG. 3 embodies a balanced arrangement of the amplifier of the invention. The differences between the embodiments of FIG. 3 and FIG. 4 will be discussed hereinafter.

First however it is remarked that specific for the unbalanced embodiment of FIG. 1 is that the load circuit 25, 10 provides a load only for the first source follower 6 so as to arrange that the second source follower 11 is unloaded, and the correctional circuit 18 drives the first bias current source 8 for the first source follower 6 only.

The operation of the amplifier of the invention can be explained as follows with reference to FIG. 1.

A signal from the first backplate 2 of the MEMS microphone 1 is buffered by the first source follower 6, of which the input voltage is biased to a reference voltage by means of a high impedance device 7, whereas the bias current is provided by first bias current source 8.

The output (source 9) of the first source follower 6 is loaded by a load circuit 25, 10 embodied as a low pass filter, of which the impedance is predominantly capacitive by the capacitor 10.

A second, inverted signal from the second backplate 3 is buffered to an unloaded output (source 14) by the second source follower 11, of which the input voltage is biased to a reference voltage by means of a high impedance device 12, and the bias current is provided by the second bias current source 13.

The embodiment of FIG. 1 provides two signals with essentially opposite polarity, the first signal at source 9 which is capacitively loaded, and which can consequently get distorted, and a second signal at source 14 which is unloaded, and consequently undistorted.

Both the signals at sources 9 and 14 are capacitively coupled to a node 17 with preferably capacitances of equal value, causing that the signal voltage at the node 17 will thus be the average of said signals at sources 9 and 14 (common mode voltage).

As long as the signal at source 9 is undistorted, the signal voltage on node 17 is zero. When the signal at source 9 gets distorted, the signal voltage on node 17 represents the distortion component of the signal at source 9.

The node 17 is coupled to the correctional circuit 18 which increases the bias current of the first bias current source 8 inversely proportional with the voltage on node 17.

The loop gain of the loop defined by the first current source 8 and the correction circuit 18 should be selected at a value which is capable to suppress the distortion on source 9. The selection of this loop gain is within the skills and expertise of the skilled person, and requires no further elucidation.

Figure 2B:
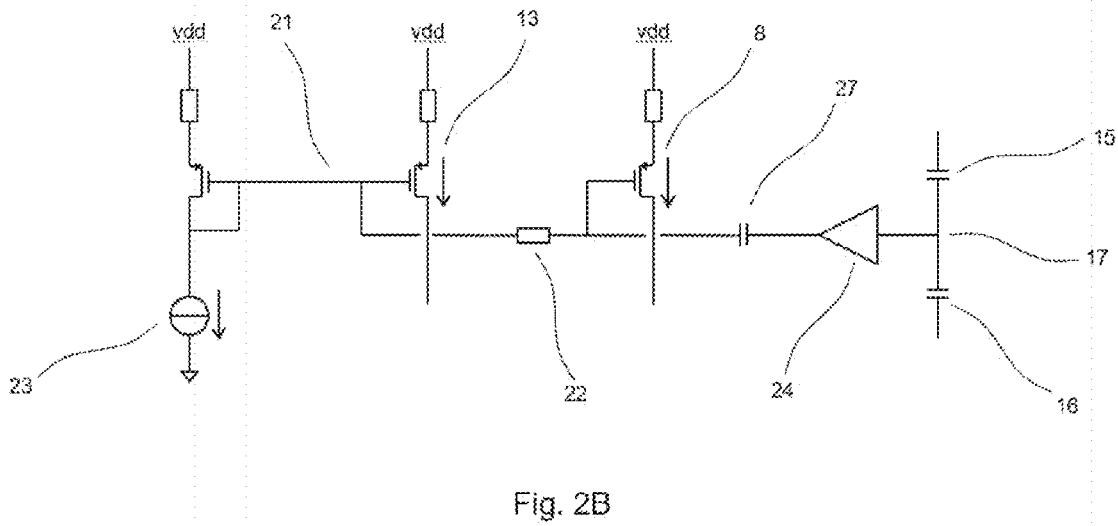

FIG. 2A and FIG. 2B show exemplary embodiments of possible constructions of the bias current sources 8, 13 as applied to the amplifier of the invention. This description of the bias current sources 8, 13 is not essential to the invention.

The bias current sources 8, 13 can for instance be implemented by p-channel MOSFETs, of which the gate-source voltage is generated by a current mirror driven by a reference current source 23. Through line 21 the constant bias current source 13 is directly connected to the current source 23.

The gate of bias current source 8 is coupled to line 21 by means of coupling resistance 22 which allows the DC level of node 17 to settle to a generated reference voltage, and the signal to equal the common mode voltage at node 17.

By proper dimensioning of said p-channel MOSFETs, sufficient loop gain is provided.

The alternative embodiment of FIG. 2B has an additional feedback amplifier 24, the output of which is coupled with coupling capacitor 27 to the gate of bias current source 8.

In this alternative arrangement source resistors have been added between the source terminals of the p-channel MOSFETs that form the current sources 8 and 13.

Specific for the embodiments of both the balanced arrangements of FIG. 3 and FIG. 4 is that the correctional circuit 18 drives the first bias current source 8 for the first source follower 6 as well as a second bias current source 13 for the second source follower 11.

FIG. 3 and FIG. 4 have in common that the load circuit 25, 10, 25' is connected between the source 9 of the first source follower 6 and the source 14 of the second source follower 11.

The embodiments of FIGS. 3 and 4 provide a full differential version as opposed to the unbalanced layout of the embodiment shown in FIG. 1. Since in the embodiment of FIG. 4 a limited amount of current consumers is applied in comparison with the embodiment of FIG. 3, the embodiment of FIG. 4 excels in low power consumption whilst still providing a full differential signal output. A disadvantage over the embodiment of FIG. 3 is however that with high currents, both the first source follower 6 and the second source follower 11 require high current levels, thus doubling the peak current consumption with large input signals. In other words: in FIG. 3 both bias current sources 8, 13 are boosted for positive and negative correctional signals, while in FIG. 4 only one of the two bias current source 8, 13 is boosted for positive correctional signals, while the other bias current source is only boosted for negative correctional signals.

Correspondingly the more complicated embodiment of FIG. 3 does not exhibit the high peak current consumption with large input signals, but at the expense of a larger number of components, which increases power consumption at low signal input levels.

Specific for the embodiment of FIG. 3 is that the amplifier comprises two distortion detection circuits, a first distortion detection circuit 15, 16 connected to the source 9 of the first source follower 6 and to a source of a third source follower 19 that is unloaded and having a gate connected to the second backplate 3 of the dual backplate MEMS microphone 1, wherein the correctional circuit 18 connects to the first distortion detection circuit 15, 16 and drives the first bias current source 8 of the first source follower 6. Further the embodiment of FIG. 3 comprises a second distortion detection circuit 15', 16' connected to the source 14 of the second source follower 11 and to a source of a fourth source follower 20 that is unloaded and having a gate connected to the first backplate 2 of the dual backplate MEMS microphone 1, wherein the correctional circuit 18 (which is usually embodied as a correctional circuit that is separate from the correctional circuit of the previous sentence that connects to the first distortion detection circuit 15, 16) further connects to the second distortion detection circuit 15', 16' and drives the second bias current source 13 of the second source follower 11.

Although the invention has been discussed in the foregoing with reference to exemplary embodiments of The amplifier for a MEMS microphone of the invention, the invention is not restricted to these particular embodiments which can be varied in many ways without departing from the invention. The discussed exemplary embodiments shall therefore not be used to construe the appended claims strictly in accordance therewith. On the contrary the embodiments are merely intended to explain the wording of the appended claims without intent to limit the claims to these exemplary embodiments. The scope of protection of the invention shall therefore be construed in accordance with the appended claims only, wherein a possible ambiguity in the wording of the claims shall be resolved using these exemplary embodiments.

It will be appreciated that the invention is also embodied in different applications involving the amplifier of the invention, to note a microphone assembly comprising a dual backplate MEMS microphone and the amplifier according to the invention, an assembly of the amplifier according to the invention assembled together with any other type of sensor, and particularly a hearing device, hearing aid, hearable, personal audio device, portable audio device, headphone, in-ear device, earbud and the like, assembled together with the amplifier according to the invention.

The invention claimed is:

1. An amplifier for a dual backplate MEMS microphone, the amplifier comprising at least:
a first source follower having a gate connected to a first backplate of the dual backplate MEMS microphone;
a second source follower connected to a second backplate of the dual backplate MEMS microphone; and
a distortion detection circuit connected to a source of the first source follower and to a source of the second source follower, the distortion detection circuit configured to measure distortion at the source of the first source follower, wherein said distortion detection circuit is connected to a correctional circuit that drives at least a first bias current source for the first source follower.

2. The amplifier of claim 1, wherein
the distortion detection circuit comprises at least two capacitors that are connected to each other in series through a node, the at least two capacitors including a first capacitor and a second capacitor, the node providing a connection between at least the first capacitor and the second capacitor,
the first capacitor is further connected to the source of the first source follower,
the second capacitor is further connected to the source of the second source follower, and
the correctional circuit connects to the node.

3. The amplifier of claim 1, wherein
the amplifier is connectable or connected to a load circuit that provides a load only for the first source follower, such that the second source follower is unloaded, and
the correctional circuit drives the first bias current source for the first source follower only.

4. The amplifier of claim 1, wherein the correctional circuit drives the first bias current source for the first source follower and a second bias current source for the second source follower.

5. The amplifier of claim 3, wherein the amplifier is connectable or connected to the load circuit between the source of the first source follower and the source of the second source follower.

6. The amplifier of claim 4, wherein the distortion detection circuit includes
a first distortion detection circuit connected to the source of the first source follower and to a source of a third source follower that is unloaded, the third source follower having a gate connected to the second backplate of the dual backplate MEMS microphone, wherein the correctional circuit connects to the first distortion detection circuit and drives the first bias current source for the first source follower, and
a second distortion detection circuit connected to the source of the second source follower and to a source of a fourth source follower that is unloaded, the fourth source follower having a gate connected to the first backplate of the dual backplate MEMS microphone, wherein the correctional circuit further connects to the second distortion detection circuit and drives the second bias current source for the second source follower.

7. A microphone assembly, comprising:
a dual backplate MEMS microphone, and
the amplifier according to claim 1.

8. An assembly, comprising:
the amplifier according to claim 1; and
a sensor, wherein the amplifier is assembled together with the sensor.

9. An assembly, comprising:
the amplifier of claim 1; and
a device assembled together with the amplifier, wherein the device is at least one of a hearing device, a hearing aid, a hearable, a personal audio device, a portable audio device, a headphone, an in-ear device, or an earbud.

* * * * *